(12) United States Patent
Song et al.

(10) Patent No.: US 9,638,962 B2
(45) Date of Patent: May 2, 2017

(54) LIQUID CRYSTAL PANEL AND MANUFACTURE METHOD THEREOF

(71) Applicant: Shenzhen China Star Optoelectronics Technology Co., Ltd., Shenzhen, Guangdong (CN)

(72) Inventors: Liwang Song, Guangdong (CN); Yong Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 75 days.

(21) Appl. No.: 14/428,979

(22) PCT Filed: Feb. 9, 2015

(86) PCT No.: PCT/CN2015/072503
§ 371 (c)(1),
(2) Date: Mar. 18, 2015

(87) PCT Pub. No.: WO2016/086539
PCT Pub. Date: Jun. 9, 2016

(65) Prior Publication Data
US 2016/0170253 A1 Jun. 16, 2016

(30) Foreign Application Priority Data
Dec. 4, 2014 (CN) .......................... 2014 1 0734669

(51) Int. Cl.
*G02F 1/1339* (2006.01)
*G02F 1/1335* (2006.01)
(Continued)

(52) U.S. Cl.
CPC ........ *G02F 1/13394* (2013.01); *H01L 27/124* (2013.01); *H01L 27/1292* (2013.01);
(Continued)

(58) Field of Classification Search
CPC ............ G02F 1/13394; G02F 1/13396; G02F 1/136222; G02F 1/136227; H01L 27/124; H01L 27/1292; H01L 51/524
See application file for complete search history.

(56) References Cited

U.S. PATENT DOCUMENTS

2002/0182766 A1* 12/2002 Yamamoto ........ G02F 1/133351
438/30
2009/0109359 A1* 4/2009 Shih ........................ G06F 3/044
349/38

(Continued)

FOREIGN PATENT DOCUMENTS

| CN | 102269834 A | 12/2011 |
|----|-------------|---------|
| CN | 104157612 A | 11/2014 |

*Primary Examiner* — Cheung Lee
*Assistant Examiner* — Stephen C Smith
(74) *Attorney, Agent, or Firm* — Andrew C. Cheng

(57) ABSTRACT

The present invention provides a liquid crystal panel and a manufacture method thereof. The liquid crystal panel comprises: a first substrate (1), a TFT layer (2) located on the first substrate (1), a color resist layer (3) located on the TFT layer (2), a photospacer layer (4) located on the color resist layer (3), a protective layer (5) located on the color resist layer (3) and the photospacer layer (4), a via hole (6) penetrating the color resist layer (3) and the protective layer (5), a pixel electrode layer (7) formed on the protective layer (5) and electrically connected to the TFT layer (2) with the via hole (6) and a second substrate (8) oppositely located to the first substrate (1), and one or more color resist material in the photospacer layer (4) and the color resist layer (3) are the same, and the photospacer layer (4) and the color resist layer (3) are formed at the same time during a manufacture process.

3 Claims, 7 Drawing Sheets

(51) Int. Cl.
*H01L 27/12* (2006.01)
*G02F 1/1362* (2006.01)

(52) U.S. Cl.
CPC .................. *G02F 1/136227* (2013.01); *G02F 2001/13396* (2013.01); *G02F 2001/136222* (2013.01)

(56) References Cited

U.S. PATENT DOCUMENTS

| | | | |
|---|---|---|---|
| 2010/0315573 A1* | 12/2010 | Hsieh | G02F 1/13394 349/61 |
| 2014/0192301 A1* | 7/2014 | Wu | G02B 5/22 349/106 |
| 2014/0354930 A1* | 12/2014 | Hirato | G02F 1/133707 349/123 |

* cited by examiner

LIQUID CRYSTAL PANEL AND MANUFACTURE METHOD THEREOF

FIELD OF THE INVENTION

The present invention relates to a display technology field, and more particularly to a liquid crystal panel and a manufacture method thereof.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

Generally, the liquid crystal display panel comprises a CF (Color Filter) substrate, a TFT (Thin Film Transistor) substrate, LC (Liquid Crystal) sandwiched between the CF substrate and the TFT substrate and sealant. The formation process generally comprises: a forepart Array process (thin film, photo, etching and stripping), a middle Cell process (Lamination of the TFT substrate and the CF substrate) and a post module assembly process (Attachment of the driving IC and the printed circuit board). The forepart Array process is mainly to form the TFT substrate for controlling the movement of the liquid crystal molecules; the middle Cell process is mainly to add liquid crystal between the TFT substrate and the CF substrate; the post module assembly process is mainly the driving IC attachment and the integration of the printed circuit board. Thus, the liquid crystal molecules are driven to rotate and display pictures.

The Active Matrix (AM) liquid crystal display is the most common liquid crystal display at present. The AMLCD manufacture technology utilizes the skill of manufacturing Color Filter on Array (COA) on the TFT array substrate, which can raise the aperture ratio of the liquid crystal panel and reduce the parasitic capacitance. Because the COA skill is utilized in the manufacture process, one side of the TFT array substrate is flatter, and the photospacer (PS) can be manufactured on one side of the TFT array substrate. The location of the photospacer is fixed at the one side of the TFT array substrate for reducing the probability of MM mura (phenomena of picture misalignment and uneven brightness) occurrence, and meanwhile, lowering the alignment demands for the upper, lower substrates in the lamination process.

However, the photospacer is formed at the one side of the TFT array substrate, one photo process is added at the one side of the TFT array substrate, which can extend the Array process time and diminish the production efficiency.

Please refer to FIG. 1, which is a COA type liquid crystal panel. In the manufacture process of the one side of the TFT array substrate, the TFT layer 200, the color resist layer 300, the protective layer 400, the pixel electrode layer 500 and the photospacer layer 600 are sequentially formed on the lower substrate. One photo process of the photospacer layer 600 is added, thus, the Array process time is longer and the production efficiency is diminished.

SUMMARY OF THE INVENTION

An objective of the present invention is to provide a liquid crystal panel, capable of reducing the probability of MM mura occurrence, and lowering the alignment demands for the upper, lower substrates in the lamination process.

Another objective of the present invention is to provide a manufacture method of a liquid crystal panel, capable of simplifying the process, saving the mask, and raising the production efficiency.

For realizing the aforesaid objectives, the present invention provides a liquid crystal panel, comprising a first substrate, a TFT layer located on the first substrate, a color resist layer located on the TFT layer, a photospacer layer located on the color resist layer, a protective layer located on the color resist layer and the photospacer layer, a via hole penetrating the color resist layer and the protective layer, a pixel electrode layer formed on the protective layer and electrically connected to the TFT layer with the via hole and a second substrate oppositely located to the first substrate, wherein one or more color resist material in the photospacer layer and the color resist layer are the same, and the photospacer layer and the color resist layer are formed at the same time during a manufacture process.

The color resist layer comprises a first color resist, a second color resist and a third color resist, and the photospacer layer comprises a main photospacer and a sub photospacer, and a height of the main photospacer is larger than a height of the sub photospacer, and the sub photospacer is located on the first color resist, and the main photospacer is located on the second color resist; material of the sub photospacer and material of the second color resist are the same, and the two are formed in the same photo process; material of the main photospacer and material of the third color resist are the same, and the two are formed in the same photo process.

The color resist layer comprises a first color resist, a second color resist and a third color resist, and the photospacer layer comprises a main photospacer and a sub photospacer, and a height of the main photospacer is larger than a height of the sub photospacer, and the main photospacer and the sub photospacer are located on the first color resist; material of the main photospacer, material of the sub photospacer and material of the second color resist are the same, and the three are formed in the same photo process.

The color resist layer comprises a first color resist, a second color resist and a third color resist, and the photospacer layer comprises a main photospacer and a sub photospacer, and a height of the main photospacer is larger than a height of the sub photospacer, and the sub photospacer is located on the first color resist, and the main photospacer is located on the second color resist; material of the main photospacer, material of the sub photospacer and material of the third color resist are the same, and the three are formed in the same photo process.

The color resist layer comprises a first color resist, a second color resist, a third color resist and a fourth color resist, and the photospacer layer comprises a main photospacer and a sub photospacer, and a height of the main photospacer is larger than a height of the sub photospacer.

The present invention further provides a manufacture method of a liquid crystal panel, comprising steps of:

step 1, providing a first substrate, and deposing a TFT layer on the first substrate;

step 2, forming a color resist layer and a photospacer layer on the TFT layer, and the photospacer layer is located on the color resist layer, and formed with the color resist layer at the same time in the manufacture process.

step 3, forming a protective layer on the color resist layer and the photospacer layer, and forming a via hole in the color resist layer and the protective layer by dry etching or wet etching;

step 4, forming an ITO thin film on the protective layer by sputtering, and forming a pixel electrode layer by wet etching, and the pixel electrode layer is electrically connected to the TFT layer with the via hole;

step 5, providing a second substrate, and injecting liquid crystal molecules between the first substrate and the second substrate, and packaging the first substrate and the second substrate.

The specific steps of step 2 comprise:

in the step 2, the color resist layer comprises a first color resist, a second color resist and a third color resist, and the photospacer layer comprises a main photospacer and a sub photospacer, and a height of the main photospacer is larger than a height of the sub photospacer;

step 21, coating a first color resist film layer on the TFT layer, and forming the first color resist by photolithography;

step 22, coating a second color resist film layer on the TFT layer and the first color resist, and forming the sub photospacer on the first color resist and the second color resist on the TFT layer at the same time by one photo process;

step 23, coating a third color resist film layer on the TFT layer, the first color resist and the second color resist, and forming the main photospacer on the second color resist and the third color resist on the TFT layer at the same time by one photo process;

wherein a thickness of the third color resist film layer coated in the step 23 is larger than a thickness of the second color resist coated in the step 22, and a height of the main photospacer formed in the step 23 is larger than a height of the sub photospacer formed in the step 22.

The specific steps of step 2 comprise:

in the step 2, the color resist layer comprises a first color resist, a second color resist and a third color resist, and the photospacer layer comprises a main photospacer and a sub photospacer, and a height of the main photospacer is larger than a height of the sub photospacer;

step 21, coating a first color resist film layer on the TFT layer, and forming the first color resist by photolithography;

step 22, coating a second color resist film layer on the TFT layer and the first color resist, and forming the main photospacer, the sub photospacer on the first color resist and the second color resist on the TFT layer at the same time by half tone mesh dot photo process;

The specific steps of step 2 comprise:

in the step 2, the color resist layer comprises a first color resist, a second color resist and a third color resist, and the photospacer layer comprises a main photospacer and a sub photospacer, and a height of the main photospacer is larger than a height of the sub photospacer;

step 21, coating a first color resist film layer on the TFT layer, and forming the first color resist by photolithography;

step 22, coating a second color resist film layer on the TFT layer, and forming the second color resist by photolithography;

step 23, coating a third color resist film layer on the TFT layer, the first color resist and the second color resist, and forming the sub photospacer on the first color resist and the main photospacer on the second color resist and the third color resist on the TFT layer at the same time by half tone mesh dot photo process.

In the step 2, the color resist layer comprises a first color resist, a second color resist, a third color resist and a fourth color resist, and the photospacer layer comprises a main photospacer and a sub photospacer, and a height of the main photospacer is larger than a height of the sub photospacer.

The present invention further provides a liquid crystal panel, comprising a first substrate, a TFT layer located on the first substrate, a color resist layer located on the TFT layer, a photospacer layer located on the color resist layer, a protective layer located on the color resist layer and the photospacer layer, a via hole penetrating the color resist layer and the protective layer, a pixel electrode layer formed on the protective layer and electrically connected to the TFT layer with the via hole and a second substrate oppositely located to the first substrate, and one or more color resist material in the photospacer layer and the color resist layer are the same, and the photospacer layer and the color resist layer are formed at the same time during a manufacture process;

wherein the color resist layer comprises a first color resist, a second color resist and a third color resist, and the photospacer layer comprises a main photospacer and a sub photospacer, and a height of the main photospacer is larger than a height of the sub photospacer, and the sub photospacer is located on the first color resist, and the main photospacer is located on the second color resist; material of the sub photospacer and material of the second color resist are the same, and the two are formed in the same photo process; material of the main photospacer and material of the third color resist are the same, and the two are formed in the same photo process.

The benefits of the present invention are: the present invention provides a manufacture method of a liquid crystal panel, which forms the photospacer layer as manufacturing the color resist layer at the same time. By utilizing the thickness difference of different color resist film layers or forming the main photospacer and the sub photospacer of different heights by half tone mesh dot photo process, the manufacture method can simplify the process, save the mask, and raise the production efficiency. The present invention provides a liquid crystal panel that utilizes the color resist material to form the photospacer layer at a side of the array substrate. Thus, the probability of MM mura occurrence can be reduced, and the alignment demands for the upper, lower substrates in the lamination process can be lowered.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
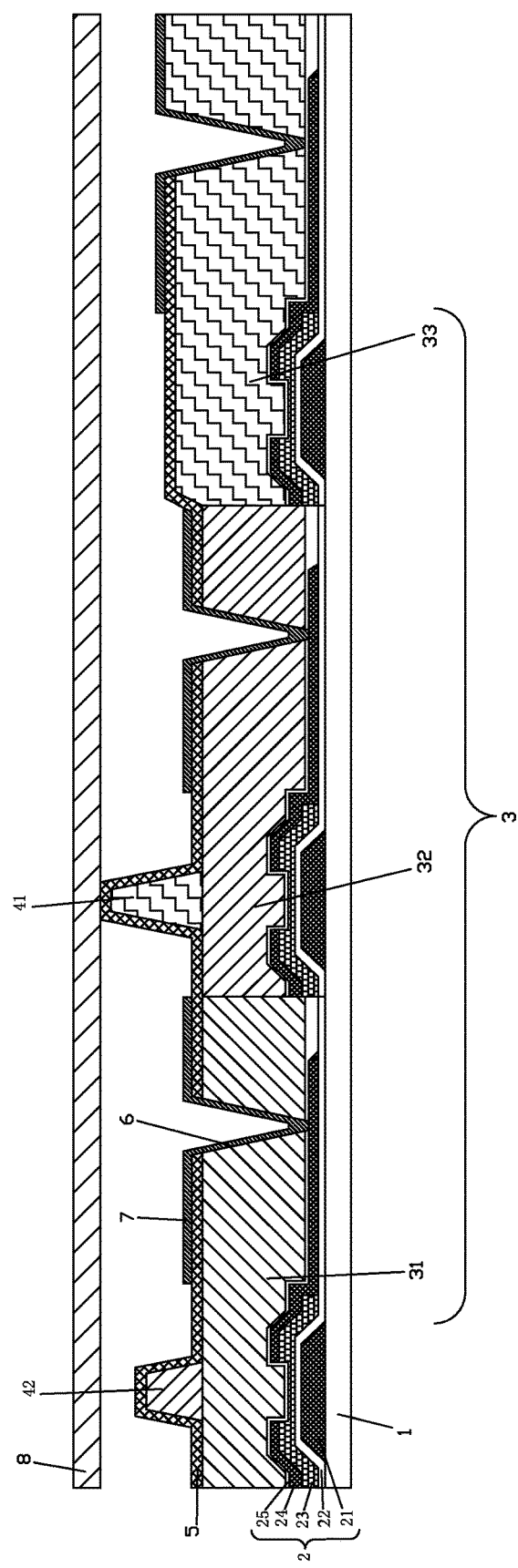
FIG. 3 is a structural diagram of a liquid crystal panel according to the first embodiment of the present invention.

Please refer to FIG. 3, which is a structural diagram of a liquid crystal panel according to the first embodiment of the present invention. As shown in FIG. 3, the present invention provides a liquid crystal panel, comprising a first substrate 1, a TFT layer 2 located on the first substrate 1, a color resist layer 3 located on the TFT layer 2, a photospacer layer 4 located on the color resist layer 3, a protective layer 5 located on the color resist layer 3 and the photospacer layer 4, a via hole 6 penetrating the color resist layer 3 and the protective layer 5, a pixel electrode layer 7 formed on the protective layer 5 and electrically connected to the TFT layer 2 with the via hole 6 and a second substrate 8 oppositely located to the first substrate 1. One or more color resist material in the photospacer layer 4 and the color resist layer 3 are the same, and the photospacer layer 4 and the color resist layer 3 are formed at the same time during a manufacture process.

The color resist layer 3 comprises a first color resist 31, a second color resist 32 and a third color resist 33. The first, the second and the third color resists respectively are arbitrary arrangement and combination of red color resist, green color resist and blue color resist. The photospacer layer 4 comprises a main photospacer 41 and a sub photospacer 42, and a height of the main photospacer 41 is larger than a height of the sub photospacer 42.

In the first embodiment of the present invention, the sub photospacer 42 is located on the first color resist 31, and the main photospacer 41 is located on the second color resist 32; material of the sub photospacer 42 and material of the second color resist 32 are the same, and the two are formed in the same photo process; material of the main photospacer 41 and material of the third color resist 33 are the same, and the two are formed in the same photo process.

Preferably, both the first substrate 1 and the second substrate 8 are glass substrates.

Specifically, the TFT layer 2 comprises a first metal layer 21, a gate isolation layer 22, a semiconductor layer 23, a second metal layer 24 and a protective layer 25. The semiconductor layer 23 can be a double layer structure composed by an a-Si layer and an n$^+$Si layer, or a single layer structure constructed by IGZO (Indium Gallium Zinc Oxide) layer; the material of the first metal layer 21 and the second metal layer 24 can be copper or aluminum.

Figure 1:
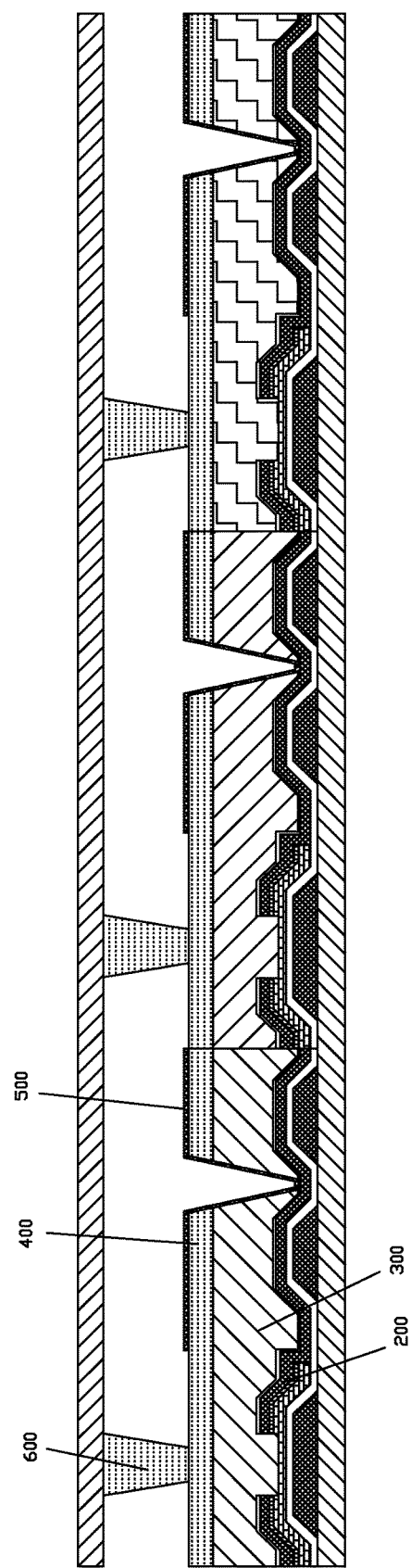
FIG. 1 is a structural diagram of a liquid crystal panel according to prior art.
Figure 2:
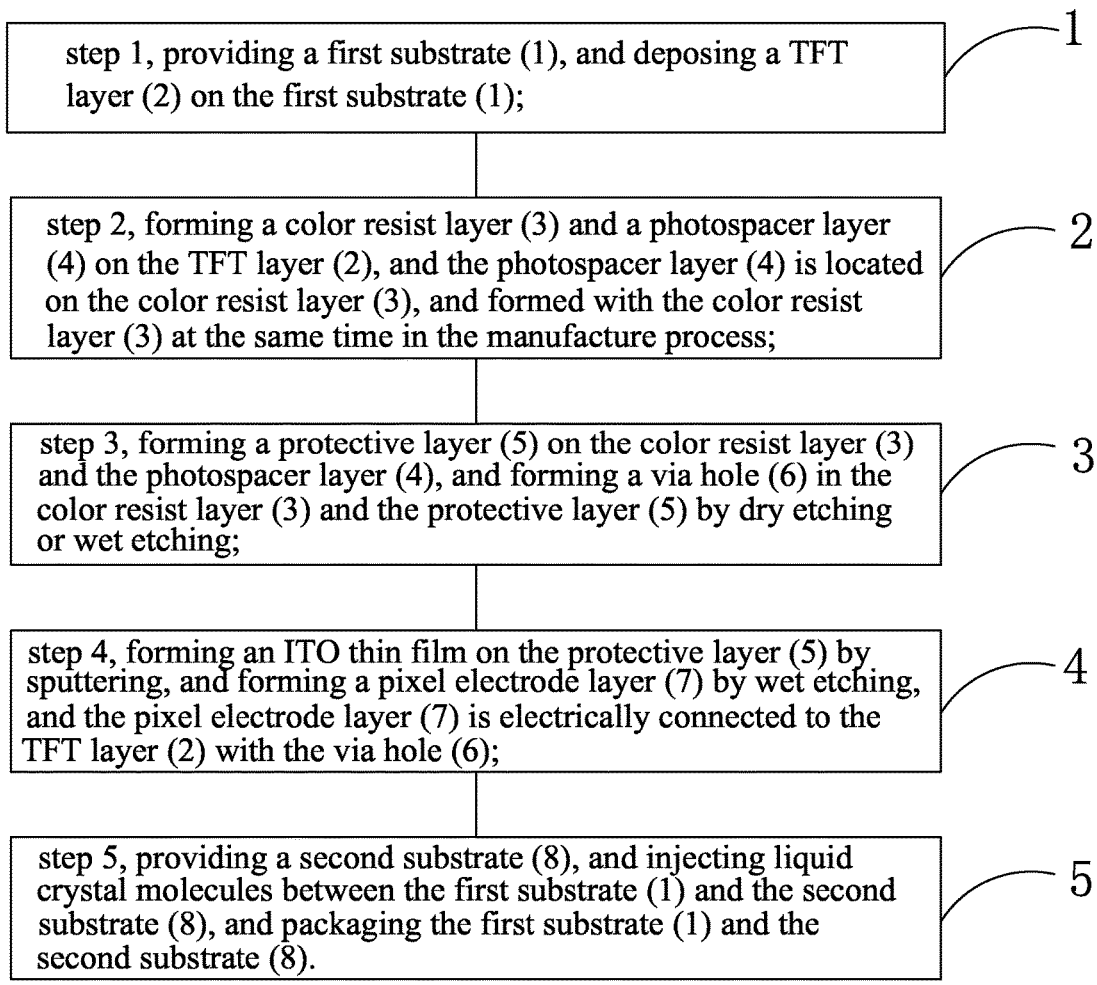
FIG. 2 is a flowchart of a manufacture method of a liquid crystal panel according to the present invention.

Please refer to FIG. 2. The manufacture method of a liquid crystal panel according to the first embodiment of the present invention comprises steps of:

step 1, providing a first substrate 1, and deposing a TFT layer 2 on the first substrate 1.

Specifically, the TFT layer 2 comprises a first metal layer 21, a gate isolation layer 22, a semiconductor layer 23, a second metal layer 24 and a protective layer 25. The semiconductor layer 23 can be a double layer structure composed by an a-Si layer and an n$^+$Si layer, or a single layer structure constructed by IGZO (Indium Gallium Zinc Oxide) layer; the material of the first metal layer 21 and the second metal layer 24 can be copper or aluminum.

step 2, forming a color resist layer 3 and a photospacer layer 4 on the TFT layer 2, and the photospacer layer 4 is located on the color resist layer 3, and formed with the color resist layer 3 at the same time in the manufacture process.

Specifically, the color resist layer 3 comprises a first color resist 31, a second color resist 32 and a third color resist 33. The first, the second and the third color resists respectively are arbitrary arrangement and combination of red color resist, green color resist and blue color resist. The photospacer layer 4 comprises a main photospacer 41 and a sub photospacer 42, and a height of the main photospacer 41 is larger than a height of the sub photospacer 42.

In the first embodiment, the step 2 comprises specific steps of:

step 21, coating a first color resist film layer on the TFT layer 2, and forming the first color resist 31 by photolithography.

step 22, coating a second color resist film layer on the TFT layer 2 and the first color resist 31, and forming the sub photospacer 42 on the first color resist 31 and the second color resist 32 on the TFT layer 2 at the same time by one photo process.

step 23, coating a third color resist film layer on the TFT layer 2, the first color resist 31 and the second color resist 32, and forming the main photospacer 41 on the second color resist 32 and the third color resist 33 on the TFT layer 2 at the same time by one photo process.

A thickness of the third color resist film layer coated in the step 23 is larger than a thickness of the second color resist coated in the step 22, and a height of the main photospacer 41 formed in the step 23 is larger than a height of the sub photospacer 42 formed in the step 22.

step 3, forming a protective layer 5 on the color resist layer 3 and the photospacer layer 4, and forming a via hole 6 in the color resist layer 3 and the protective layer 5 by dry etching or wet etching.

step 4, forming an ITO thin film on the protective layer 5 by sputtering, and forming a pixel electrode layer 7 by wet etching, and the pixel electrode layer 7 is electrically connected to the TFT layer 2 with the via hole 6.

step 5, providing a second substrate 8, and injecting liquid crystal molecules between the first substrate 1 and the second substrate 8, and packaging the first substrate 1 and the second substrate 8.

Preferably, both the first substrate 1 and the second substrate 8 are glass substrates.

Figure 4:
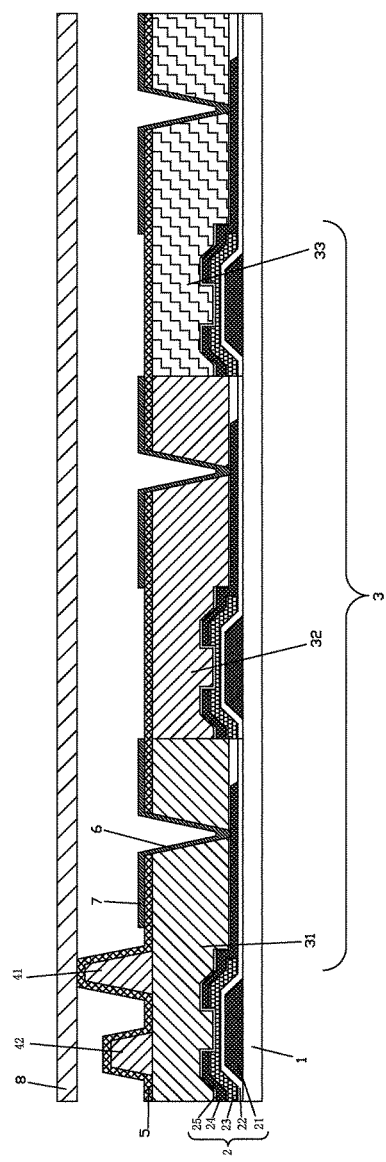
FIG. 4 is a structural diagram of a liquid crystal panel according to the second embodiment of the present invention.

Please refer to FIG. 4, which is a structure diagram of the liquid crystal panel according to the second embodiment of the present invention. Compared with the structure of the first embodiment of the present invention, the difference is that the structure of the photospacer layer 4 is slightly different.

In the liquid crystal panel according to the second embodiment of the present invention, the color resist layer 3 comprises a first color resist 31, a second color resist 32 and a third color resist 33 which are sequentially arranged, and the photospacer layer 4 comprises a main photospacer 41 and a sub photospacer 42, and a height of the main photospacer 41 is larger than a height of the sub photospacer 42.

Both the main photospacer 41 and the sub photospacer 42 of the photospacer layer 4 are located on the first color resist 31. Material of the main photospacer 41, material of the sub photospacer 42 and material of the second color resist 32 in the color resist layer 3 are the same, and the three are formed in the same photo process.

Figure 5:
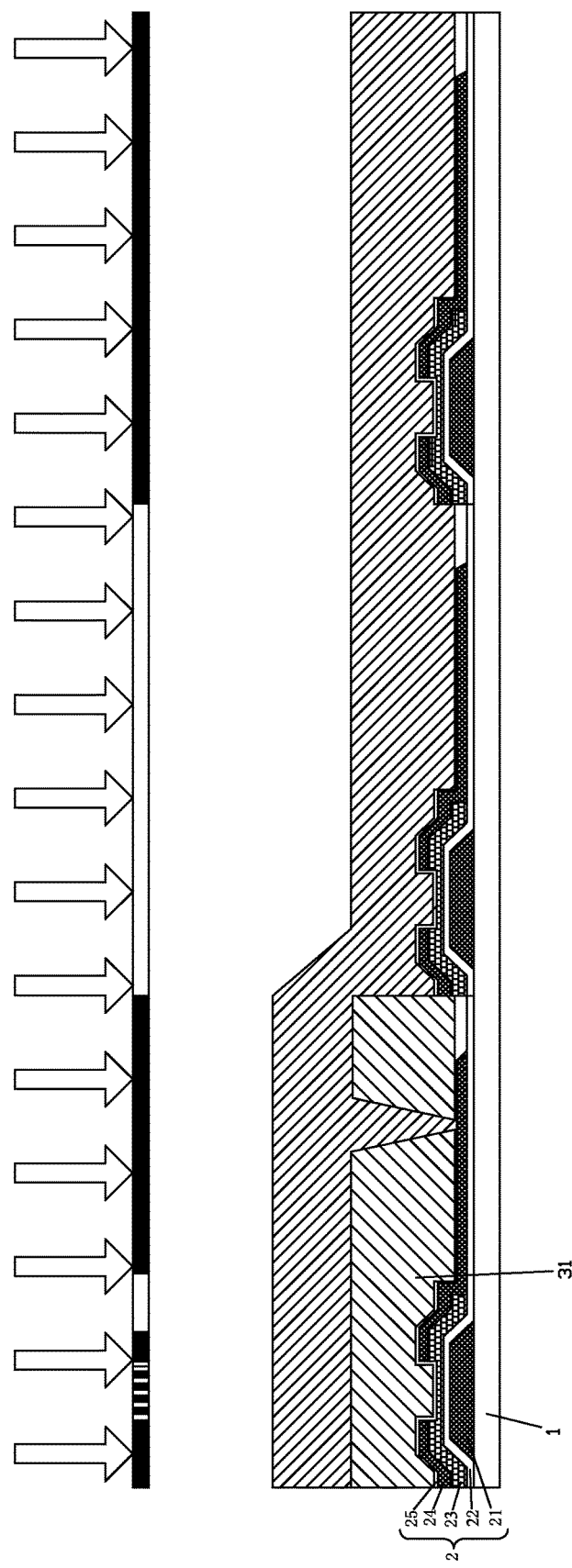
FIG. 5 is a diagram of the step 22 in the manufacture method of the liquid crystal panel according to the second embodiment of the present invention.

The manufacture method of the liquid crystal panel according to the second embodiment of the present invention is similar with the manufacture method of the liquid crystal panel according to the first embodiment of the present invention. The difference is that the specific steps of the step 2 are different. In the manufacture method of the liquid crystal panel according to the second embodiment of the present invention, the specific steps of the step 2 comprise:

step 21, coating a first color resist film layer on the TFT layer 2, and forming the first color resist 31 by photolithography.

step 22, as shown in FIG. 5, coating a second color resist film layer on the TFT layer 2 and the first color resist 31, and forming the main photospacer 41, the sub photospacer 42 on the first color resist 31 and the second color resist 32 on the TFT layer 2 at the same time by half tone mesh dot photo process.

In the step 22, with utilizing the half tone mesh dot photo process to manufacture the main photospacer 41 and the sub photospacer 42 of different heights at the same time, it can simplify the process, save the mask, and raise the production efficiency.

step 23, coating a third color resist film layer on the TFT layer 2, the first color resist 31 and the second color resist 32, and forming the third color resist 33 by photolithography.

Figure 6:
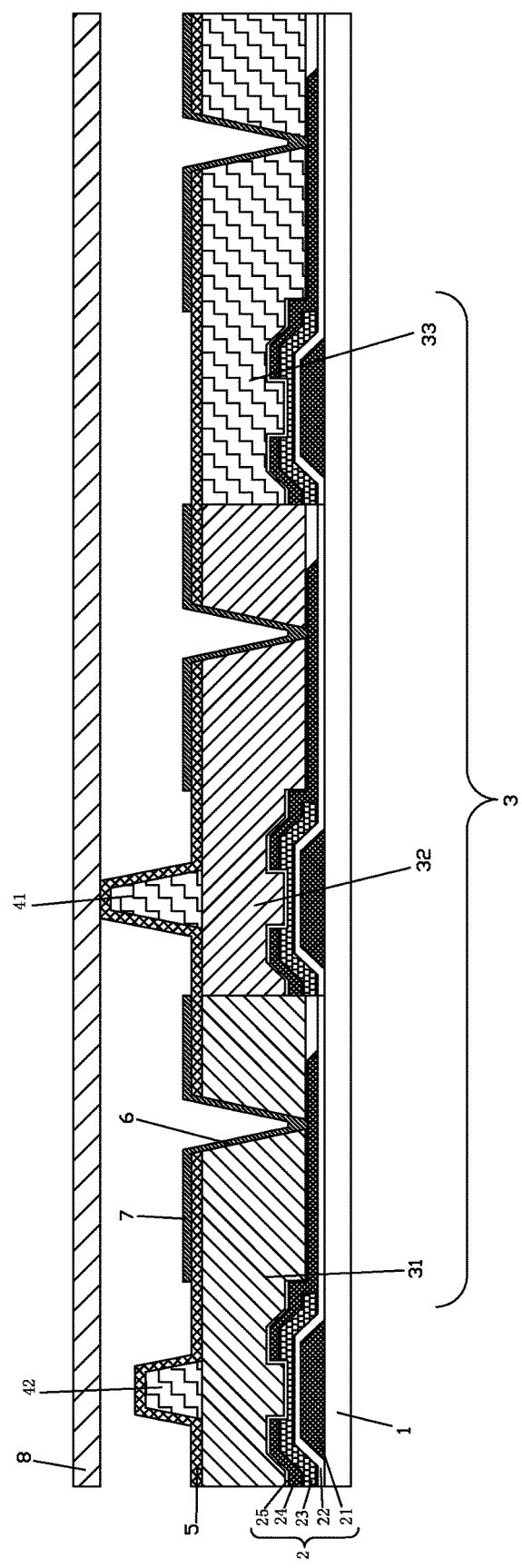
FIG. 6 is a structural diagram of a liquid crystal panel according to the third embodiment of the present invention.

Please refer to FIG. 6, which is a structure diagram of the liquid crystal panel according to the third embodiment of the present invention. Compared with the structure of the first embodiment of the present invention, the difference is that the structure of the photospacer layer 4 is slightly different.

In the liquid crystal panel according to the third embodiment of the present invention, the color resist layer 3 comprises a first color resist 31, a second color resist 32 and a third color resist 33 which are sequentially arranged, and the photospacer layer 4 comprises a main photospacer 41 and a sub photospacer 42, and a height of the main photospacer 41 is larger than a height of the sub photospacer 42.

The sub photospacer 42 is located on the first color resist 31, and the main photospacer 41 is located on the second color resist 32, and material of the main photospacer 41, material of the sub photospacer 42 and material of the third color resist 33 are the same, and the three are formed in the same photo process.

Figure 7:
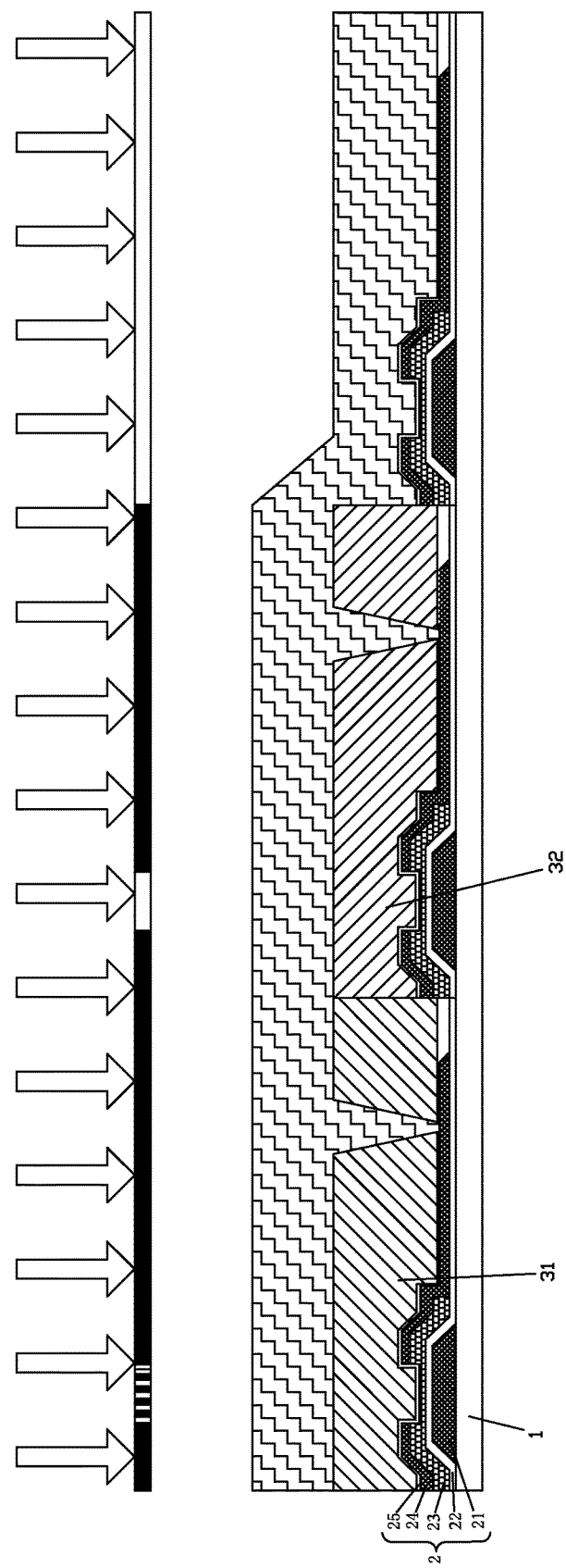
FIG. 7 is a diagram of the step 23 in the manufacture method of the liquid crystal panel according to the third embodiment of the present invention.

The manufacture method of the liquid crystal panel according to the third embodiment of the present invention is similar with the manufacture method of the liquid crystal panel according to the first embodiment of the present invention. The difference is that the specific steps of the step 2 are different. In the manufacture method of the liquid crystal panel according to the third embodiment of the present invention, the specific steps of the step 2 comprise:

step 21, coating a first color resist film layer on the TFT layer 2, and forming the first color resist 31 by photolithography.

step 22, coating a second color resist film layer on the TFT layer 2, and forming the second color resist 32 by photolithography.

step 23, as shown in FIG. 7, coating a third color resist film layer on the TFT layer 2, the first color resist 31 and the second color resist 32, and forming the sub photospacer 42 on the first color resist 31, the main photospacer 41 on the second color resist 32 and the third color resist 33 on the TFT layer 2 at the same time by half tone mesh dot photo process.

In the step 23, with utilizing the half tone mesh dot photo process to manufacture the main photospacer 41 and the sub photospacer 42 of different heights at the same time, it can simplify the process, save the mask, and raise the production efficiency.

The invention structure of the present invention is similarly applied to the condition that the color resist layer comprises four color resists, i.e. the color resist layer comprises a first color resist, a second color resist, a third color resist and a fourth color resist. The first, the second, the third and the fourth color resists respectively are arbitrary arrangement and combination of red color resist, green color resist, blue color resist and white color resist or arbitrary arrangement and combination of red color resist, green color resist, blue color resist and yellow color resist.

In conclusion, the present invention provides a liquid crystal panel that utilizes the color resist material to form the photospacer layer at a side of the array substrate. Thus, the probability of MM mura occurrence can be reduced, and the alignment demands for the upper, lower substrates in the lamination process can be lowered. The present invention further provides a manufacture method of a liquid crystal panel, which forms the photospacer layer as manufacturing the color resist layer at the same time. By utilizing the thickness difference of different color resist film layers or forming the main photospacer and the sub photospacer of different heights by half tone mesh dot photo process, the manufacture method can simplify the process, save the mask, and raise the production efficiency.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a liquid crystal panel, comprising steps of:
   step 1, providing a first substrate, and deposing a TFT layer on the first substrate;
   step 2, forming a color resist layer and a photospacer layer on the TFT layer, and the photospacer layer is located on the color resist layer, and formed with the color resist layer at the same time in the manufacture process;
   step 3, forming a protective layer on the color resist layer and the photospacer layer, and forming a via hole in the color resist layer and the protective layer by dry etching or wet etching;
   step 4, forming an ITO thin film on the protective layer by sputtering, and forming a pixel electrode layer by wet etching, and the pixel electrode layer is electrically connected to the TFT layer with the via hole; and
   step 5, providing a second substrate, and injecting liquid crystal molecules between the first substrate and the second substrate, and packaging the first substrate and the second substrate;
   wherein in step 2, the color resist layer comprises a first color resist, a second color resist and a third color resist, and the photospacer layer comprises a main photospacer and a sub photospacer, and a height of the main photospacer is larger than a height of the sub photospacer; and step 2 comprises the following steps:

step 2.1, coating a first color resist film layer on the TFT layer, and forming the first color resist by photolithography;

step 2.2, coating a second color resist film layer on the TFT layer and the first color resist, and forming the sub photospacer on the first color resist and the second color resist on the TFT layer at the same time by one photo process; and step 2.3, coating a third color resist film layer on the TFT layer, the first color resist and the second color resist, and forming the main photospacer on the second color resist and the third color resist on the TFT layer at the same time by one photo process;

wherein a thickness of the third color resist film layer coated in the step 23 is larger than a thickness of the second color resist coated in the step 22, and a height of the main photospacer formed in the step 23 is larger than a height of the sub photospacer formed in the step 22.

2. A manufacture method of a liquid crystal panel, comprising steps of:

step 1, providing a first substrate, and deposing a TFT layer on the first substrate;

step 2, forming a color resist layer and a photospacer layer on the TFT layer, and the photospacer layer is located on the color resist layer, and formed with the color resist layer at the same time in the manufacture process;

step 3, forming a protective layer on the color resist layer and the photospacer layer, and forming a via hole in the color resist layer and the protective layer by dry etching or wet etching;

step 4, forming an ITO thin film on the protective layer by sputtering, and forming a pixel electrode layer by wet etching, and the pixel electrode layer is electrically connected to the TFT layer with the via hole; and step 5, providing a second substrate, and injecting liquid crystal molecules between the first substrate and the second substrate, and packaging the first substrate and the second substrate;

wherein in step 2, the color resist layer comprises a first color resist, a second color resist and a third color resist, and the photospacer layer comprises a main photospacer and a sub photospacer, and a height of the main photospacer is larger than a height of the sub photospacer; and step 2 comprises the following steps:

step 2.1, coating a first color resist film layer on the TFT layer, and forming the first color resist by photolithography; and step 2.2, coating a second color resist film layer on the TFT layer and the first color resist, and forming the main photospacer, the sub photospacer on the first color resist and the second color resist on the TFT layer at the same time by half tone mesh dot photo process.

3. A manufacture method of a liquid crystal panel, comprising steps of:

step 1, providing a first substrate, and deposing a TFT layer on the first substrate;

step 2, forming a color resist layer and a photospacer layer on the TFT layer, and the photospacer layer is located on the color resist layer, and formed with the color resist layer at the same time in the manufacture process;

step 3, forming a protective layer on the color resist layer and the photospacer layer, and forming a via hole in the color resist layer and the protective layer by dry etching or wet etching;

step 4, forming an ITO thin film on the protective layer by sputtering, and forming a pixel electrode layer by wet etching, and the pixel electrode layer is electrically connected to the TFT layer with the via hole; and step 5, providing a second substrate, and injecting liquid crystal molecules between the first substrate and the second substrate, and packaging the first substrate and the second substrate;

wherein in step 2, the color resist layer comprises a first color resist, a second color resist and a third color resist, and the photospacer layer comprises a main photospacer and a sub photospacer, and a height of the main photospacer is larger than a height of the sub photospacer; and step 2 comprises the following steps:

step 2.1, coating a first color resist film layer on the TFT layer, and forming the first color resist by photolithography;

step 2.2, coating a second color resist film layer on the TFT layer, and forming the second color resist by photolithography; and step 2.3, coating a third color resist film layer on the TFT layer, the first color resist and the second color resist, and forming the sub photospacer on the first color resist and the main photospacer on the second color resist and the third color resist on the TFT layer at the same time by half tone mesh dot photo process.

* * * * *